(12) United States Patent
Ge

(10) Patent No.: US 12,310,033 B2
(45) Date of Patent: *May 20, 2025

(54) CROSSBAR ARRAY CIRCUIT WITH PARALLEL GROUNDING LINES

(71) Applicant: TetraMem Inc., Fremont, CA (US)

(72) Inventor: Ning Ge, Danville, CA (US)

(73) Assignee: TetraMem Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/170,837

(22) Filed: Feb. 17, 2023

(65) Prior Publication Data
US 2023/0209841 A1    Jun. 29, 2023

Related U.S. Application Data

(63) Continuation of application No. 17/357,341, filed on Jun. 24, 2021, now Pat. No. 11,610,942, which is a continuation of application No. 16/693,228, filed on Nov. 23, 2019, now Pat. No. 11,069,742.

(51) Int. Cl.
| | | |
|---|---|---|
| *G11C 13/00* | (2006.01) | |
| *H10B 63/00* | (2023.01) | |
| *H10N 70/00* | (2023.01) | |
| *H10N 70/20* | (2023.01) | |

(52) U.S. Cl.
CPC ......... *H10B 63/30* (2023.02); *G11C 13/0002* (2013.01); *G11C 13/003* (2013.01); *H10B 63/84* (2023.02); *H10N 70/253* (2023.02); *H10N 70/821* (2023.02); *G11C 2213/74* (2013.01)

(58) Field of Classification Search
CPC ............. H01L 27/2436; H01L 27/2481; H01L 45/1206; H01L 45/122; G11C 13/0002; G11C 13/003; G11C 2213/74; G11C 2213/79; G11C 2213/82
USPC .................................................. 365/148, 158
See application file for complete search history.

(56) References Cited

U.S. PATENT DOCUMENTS

| | | |
|---|---|---|
| 6,768,156 B1 | 7/2004 | Bhattacharyya |
| 6,919,647 B2 | 7/2005 | Hackler et al. |
| 9,577,009 B1 | 2/2017 | Shih et al. |
| 9,853,053 B2 * | 12/2017 | Lupino ............. H01L 27/11803 |
| 9,887,006 B1 | 2/2018 | Strenz et al. |
| 10,096,362 B1 | 10/2018 | Nazarian et al. |
| 10,262,731 B2 | 4/2019 | Chang et al. |
| 10,418,103 B1 | 9/2019 | Buchanan et al. |
| 10,573,375 B1 | 2/2020 | He et al. |

(Continued)

FOREIGN PATENT DOCUMENTS

| | | | | |
|---|---|---|---|---|
| CN | 113157034 A | * | 7/2021 | ............. G05F 1/561 |
| JP | 2004186553 A | * | 7/2004 | ............. G11C 11/15 |
| WO | WO-2020177089 A1 | * | 9/2020 | |

*Primary Examiner* — Michael T Tran
(74) *Attorney, Agent, or Firm* — Jaffery Watson Hamilton & DeSanctis LLP

(57) ABSTRACT

Technologies relating to crossbar array circuits with parallel ground lines are disclosed. An example crossbar array circuit may include a plurality of transistors. The crossbar array circuit may include an RRAM device connected in series with a first transistor and a second transistor; a first bit line connected to the RRAM device; and a grounding line connected to a body terminal of the first transistor. The grounding line is parallel to the first bit line. In some embodiments, the first transistor is an NMOS transistor. The second transistor is a PMOS transistor.

10 Claims, 4 Drawing Sheets

(56) References Cited

U.S. PATENT DOCUMENTS

| | | |
|---|---|---|
| 11,069,742 B2 | 7/2021 | Ge |
| 2003/0189865 A1 | 10/2003 | Ausserlechner et al. |
| 2004/0042268 A1 | 3/2004 | Bhattacharyya |
| 2009/0168493 A1 | 7/2009 | Kim et al. |
| 2009/0201742 A1 | 8/2009 | Lee et al. |
| 2013/0027081 A1 | 1/2013 | Nazarian et al. |
| 2014/0146600 A1 | 5/2014 | Sohn et al. |
| 2014/0166961 A1 | 6/2014 | Liao et al. |
| 2014/0198551 A1 | 7/2014 | Louie et al. |
| 2014/0264222 A1* | 9/2014 | Yang .................. H01L 29/7835 438/238 |
| 2014/0268988 A1 | 9/2014 | Cai et al. |
| 2015/0023089 A1 | 1/2015 | Kolluri et al. |
| 2015/0085558 A1* | 3/2015 | Chang ................ G11C 13/0021 365/148 |
| 2015/0117104 A1* | 4/2015 | Senoo ................ G11C 16/0483 365/185.12 |
| 2016/0180957 A1 | 6/2016 | Nishiyama |
| 2016/0211016 A1 | 7/2016 | Tsai et al. |
| 2016/0379710 A1 | 12/2016 | Sekar et al. |
| 2017/0103808 A1 | 4/2017 | Franca-Neto |
| 2017/0140819 A1* | 5/2017 | Lee .................... G11C 13/0069 |
| 2018/0122825 A1* | 5/2018 | Lupino ................ H10B 63/20 |
| 2018/0190353 A1 | 7/2018 | Srinivasan et al. |
| 2018/0358408 A1 | 12/2018 | Lee et al. |
| 2019/0035458 A1 | 1/2019 | Lu et al. |
| 2019/0074429 A1 | 3/2019 | Karpov et al. |
| 2019/0080753 A1 | 3/2019 | Tran et al. |
| 2019/0080754 A1 | 3/2019 | Tran et al. |
| 2019/0096483 A1 | 3/2019 | Lee et al. |
| 2019/0139604 A1 | 5/2019 | Lee et al. |
| 2019/0164606 A1* | 5/2019 | Chih .................. G11C 13/0026 |
| 2019/0238134 A1* | 8/2019 | Lee .................... H01L 23/5386 |
| 2019/0363087 A1 | 11/2019 | Zhou |
| 2019/0385677 A1 | 12/2019 | Pillarisetty et al. |
| 2019/0393267 A1 | 12/2019 | Pillarisetty et al. |
| 2020/0020742 A1 | 1/2020 | Liu et al. |
| 2020/0266239 A1* | 8/2020 | Liu ..................... G11C 13/004 |
| 2021/0159274 A1* | 5/2021 | Ge ...................... H10N 70/253 |
| 2021/0320148 A1* | 10/2021 | Ge ...................... H10B 63/84 |
| 2022/0077389 A1* | 3/2022 | Zhang ................. H10N 70/021 |
| 2022/0320430 A1* | 10/2022 | Zhang ................. H10N 70/24 |
| 2022/0336012 A1* | 10/2022 | Chang ................ G11C 13/0069 |

* cited by examiner

CROSSBAR ARRAY CIRCUIT WITH PARALLEL GROUNDING LINES

CROSS-REFERENCE TO RELATED APPLICATIONS

This application is a continuation of U.S. patent application Ser. No. 17/357,341, filed on Jun. 24, 2021, issued as U.S. Pat. No. 11,610,942, which is a continuation of U.S. patent application Ser. No. 16/693,228, filed on Nov. 23, 2019, issued as U.S. Pat. No. 11,069,742, each of which is hereby incorporated by reference in its entireties.

TECHNICAL FIELD

The present disclosure generally related to crossbar array circuits, and more specifically to crossbar array circuits with parallel grounding lines.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

An RRAM is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) and a Low-Resistance State (LRS). The switching event from an HRS to an LRS is often referred to as a "Set" or "On" switch; the switching systems from an LRS to an HRS is often referred to as a "Reset" or "Off" switching process.

A Metal-Oxide-Semiconductor Field-Effect Transistor (MOSFET, MOS-FET, or MOS FET), which is also called as a Metal-Oxide-Silicon Transistor (a MOS transistor or simply a MOS), is a type of field-effect transistor (FET) that is fabricated by controlled oxidation of silicon. If a MOSFET is an n-channel MOSFET (or an NMOS FET), then the source and the drain of the NMOS FET are $n^1$ regions and the body of the NMOS FET is a p region. If a MOSFET is a p-channel MOSFET (or a PMOS FET), then the source and the drain of the NMOS FET are $p^1$ regions and the body of the PMOS FET is an n region. A source provides charge carriers (electrons for n-channel, holes for p-channel) that flow through a channel; similarly, a drain is where the charge carriers leave the channel.

SUMMARY

Technologies relating to crossbar array circuits with parallel grounding lines are disclosed.

An example apparatus includes: a word line; a bit line; a first selector line; a grounding line; a first transistor including a first source terminal, a first drain terminal, a first gate terminal, and a first body terminal; and an RRAM device connected in series with the first transistor, wherein the grounding line is connected to the first body terminal and is grounded, and the grounding line is parallel to the bit line, wherein the first selector line is connected to the first gate terminal.

In some implementations, the RRAM device is connected between the first transistor via the first drain terminal and the word line, and the first source terminal is connected to the bit line.

The apparatus, in some implementations, further includes: a second selector line; and a second transistor including a second source terminal, a second drain terminal, a second gate terminal, and a second body terminal, wherein the second selector line is connected to the second gate terminal.

In some implementations, the first transistor is an NMOS transistor, and the second transistor is a PMOS transistor.

In some implementations, the RRAM device is connected between the second transistor via the second drain terminal and the word line, and the second source terminal is connected to the bit line.

The apparatus, in some implementations, further includes: a diode connected between the second body terminal and the bit line, wherein the diode is configured to provide a reverse bias to the second transistor.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to crossbar array circuits with parallel grounding lines are disclosed. The technologies described in the present disclosure may provide the following technical advantages.

First, the disclosed technologies provide various crossbar array circuit designs with body bias for increasing the threshold gate voltage of transistors, providing greater selectivity and controllability of the transistors in one-transistor-one-memristor (1T1R), 2T1R, and nTnR architectures.

Second, designs having parallel grounding lines as described in the present disclosure may provide shielding effect, reducing or eliminating crosstalk between bit lines or word lines, a desirable technical advantage.

Third, reducing noises between bit lines and word lines, especially during in-memory computing operations, can significantly improve computation accuracy and reduce computation errors caused by sneak current and crosstalk.

Figures 1A, 1B:
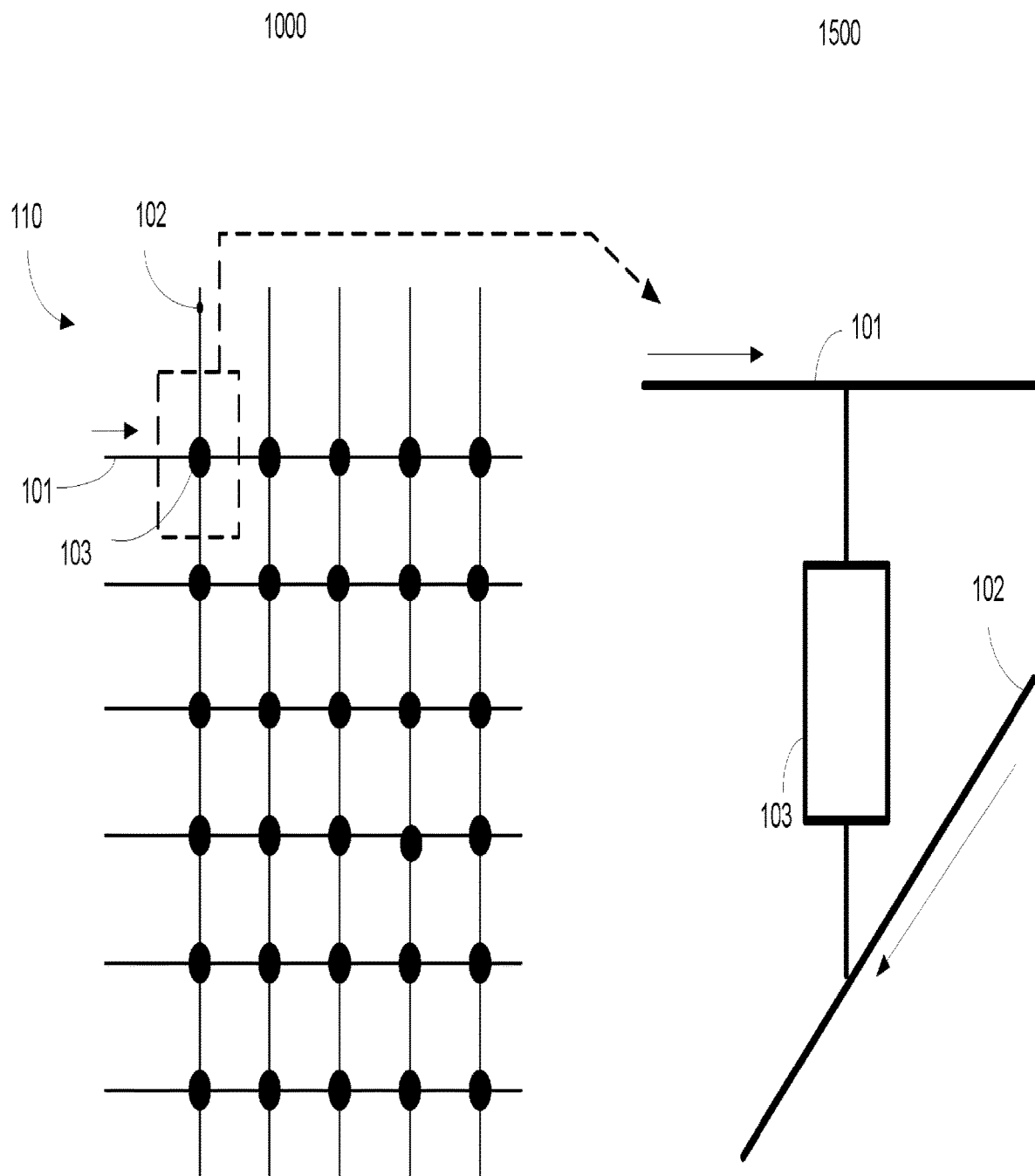
FIG. 1A is a block diagram illustrating an example crossbar array circuit in accordance with some implementations of the present disclosure.
FIG. 1B is a block diagram illustrating a partially enlarged view of an example cross-point device in accordance with some implementations.

FIG. 1A is a block diagram 1000 illustrating an example crossbar array circuit 110 in accordance with some implementations of the present disclosure. As shown in FIG. 1A, the crossbar array circuit 110 includes one or more word lines (e.g., a first word line 101), one or more bit lines (e.g., a first bit line 102), and one or more cross-point devices (e.g., a first cross-point device 103).

FIG. 1B shows a block diagram 1500 illustrating a partially enlarged view of the first cross-point device 103 in accordance with some implementations. As shown in FIG. 1B, the first cross-point device 103 is connected to the first word line 101 and to the first bit line 102. A cross-point device may have different architectures, such as a one-transistor-one-memristor (1T1R) architecture, a two-transistor-one-memristor (2T1R) architecture, or an nTnR architecture.

Figure 2A:
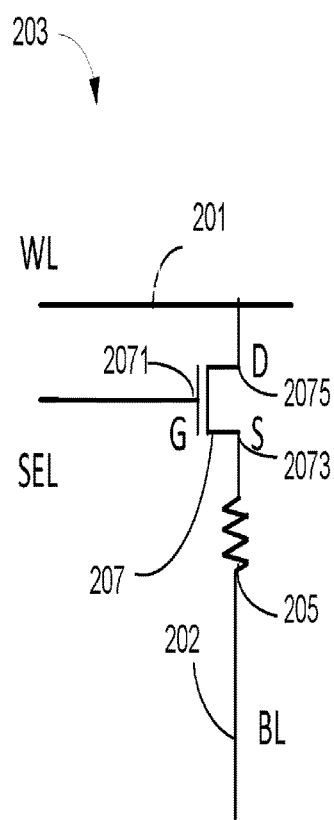
FIGS. 2A-2C are block diagrams illustrating various example cross-point devices in accordance with some implementations of the present disclosure.
Figure 2B:
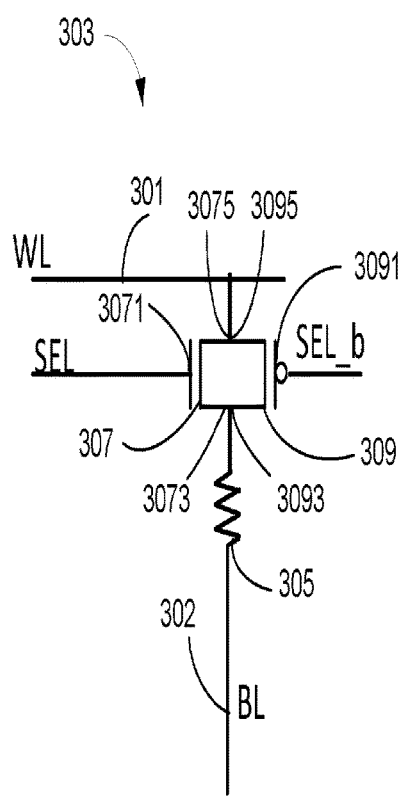
Figure 2C:
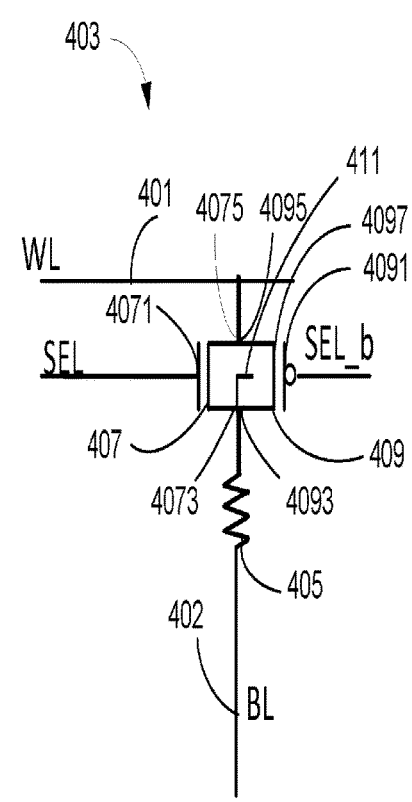

FIGS. 2A-2C are block diagrams illustrating various cross-point devices in accordance with some implementations of the present disclosure.

In some implementations, as shown in FIG. 2A, a 1T1R RRAM cell 203 includes a first word line 201, a first bit line 202, a first transistor 207 (e.g. an NMOS transistor 207), and an RRAM device 205. As shown in FIG. 2A, the NMOS transistor 207 is connected in series with the RRAM device 205; the RRAM device 205 is connected between a source terminal 2073 of the NMOS transistor 207 and the first bit line 202.

A gate terminal 2071 of the NMOS transistor 207 is connected to a selector voltage source. The selector voltage source enables the NOMS transistor 207 to control whether the RRAM device 205 is selected to be programmed or not.

In a 1T1R architecture, the RESET current may be limited due to such factors as: (1) the transistor is in the saturation region. Increasing the word line voltage thus does not increase the RESET current significantly; (2) the NMOS source voltage cannot be greater than VDD-Vtn and is therefore limited; and (3) significant body effect.

A 2T1R RRAM cell architecture may solve the technical problems identified above, without significantly increasing the area size from that required in the 1T1R RRAM cell architecture, in accordance with various simulations.

In some implementations, as shown in FIG. 2B, a 2T1R RRAM cell 303 includes a first word line 301, a first bit line 302, a first transistor 307 (e.g., an NMOS transistor 307), a second transistor 309 (e.g., a PMOS transistor 309), and an RRAM device 305. As shown in FIG. 2B, the NMOS transistor 307 and the PMOS transistor 309 are connected in series with the RRAM device 305.

The RRAM device 305 is connected between an NMOS source terminal 3073 of the NMOS transistor 307 and the first bit line 302, and also between a PMOS source terminal 3093 of the PMOS transistor 309 and the first bit line 302.

An NMOS gate terminal 3071 of the NMOS transistor 307 is connected to a first selector voltage source, while a PMOS gate terminal 3091 of the PMOS transistor 309 is connected to a second selector voltage source. The selector voltage source enables the transistors to control whether the RRAM device 305 is selected to be programmed or not.

In some implementations, the first selector voltage source and the second selector voltage source may be connected by an invertor such that the two selector voltage sources may be controlled by the same selector voltage source.

As discussed above, the 2T1R architecture provides better selectivity and controllability of a RRAM cell.

In some implementations, further provided in a 2T1R architecture is a body bias connected to a body terminal of a PMOS transistor.

In some implementations, as shown in FIG. 2C, a PMOS-diode-connected 2T1R RRAM cell 403 includes a first word line 401, a first bit line 402, a first transistor 407 (e.g., an NMOS transistor 407), a second transistor 409 (e.g., a PMOS transistor 409), a diode 411, and an RRAM device 405. As shown in FIG. 2C, the NMOS transistor 407 and the PMOS transistor 409 are connected in series with the RRAM device 405.

The RRAM device 405 is connected (1) between an NMOS source terminal 4073 of the NMOS transistor 407 and the first bit line 402 and (2) between a PMOS source terminal 4093 of the PMOS transistor 409 and the first bit line 402.

An NMOS gate terminal 4071 of the NMOS transistor 407 is connected to a first selector voltage source, while a PMOS gate terminal 4091 of the PMOS transistor 409 is connected to a second selector voltage source. The selector voltage source enables the transistors 407 and 409 to control whether the RRAM device 405 is selected to be programmed or not. The diode 411 is connected between and the RRAM device 405 and a PMOS body terminal 4097 of the PMOS transistor 409.

In some implementations, the diode 411 is configured to provide a reverse bias to the PMOS transistor 409. This reverse bias increases the threshold gate voltage of the transistors, providing greater selectivity and controllability of the transistors.

As explained above, parallel grounding lines provided in the body terminal of a transistor may also provide a shielding effect, such as preventing crosstalk, noise, and interference between bit lines. Therefore, additional parallel grounding lines may be implemented in a crossbar array circuit. These technologies may also be applied to word lines.

Figure 3:
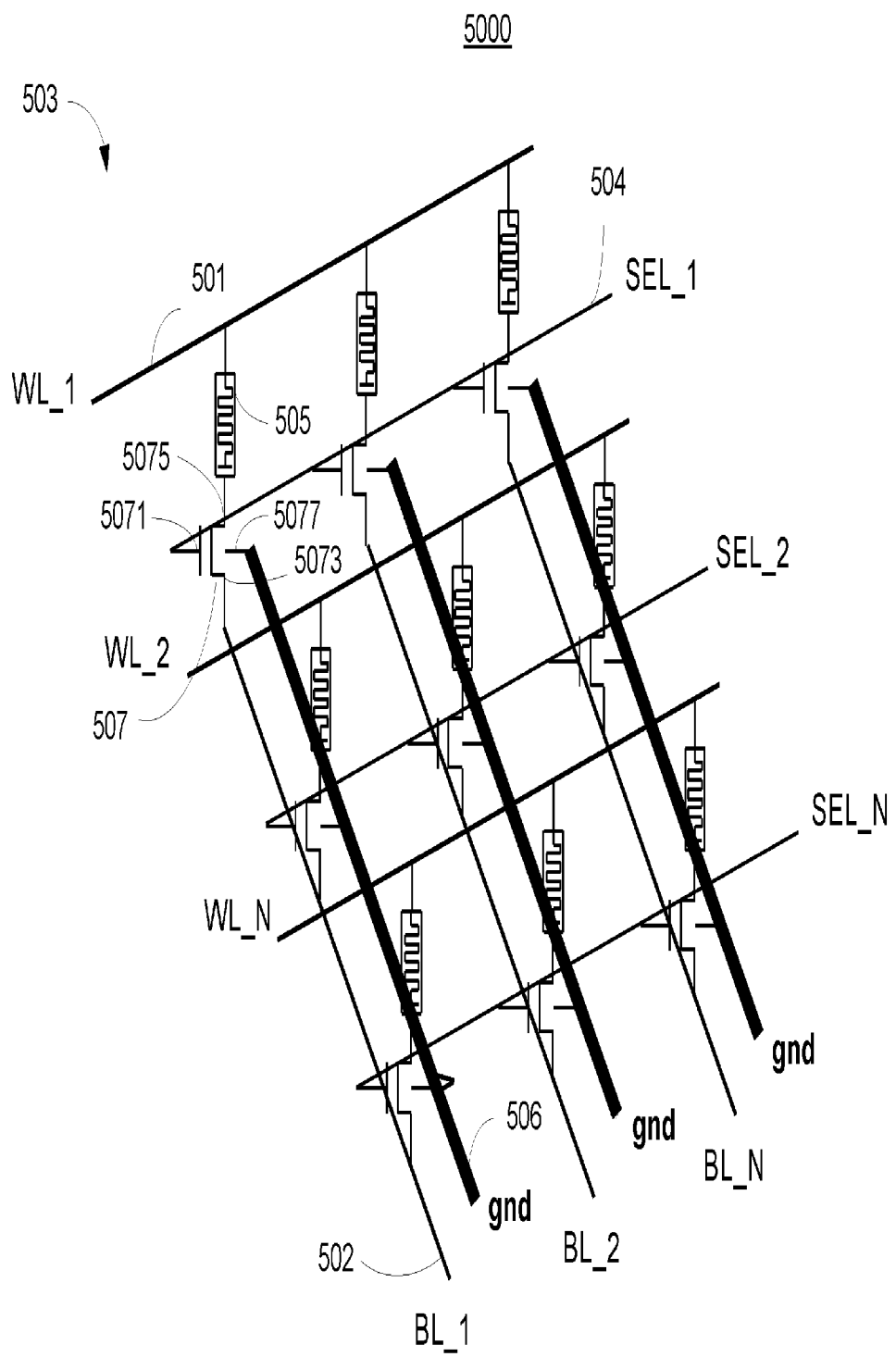
FIG. 3 is a block diagram illustrating an example 1T1R crossbar array circuit in accordance with some implementations of the present disclosure.

FIG. 3 is a block diagram 5000 illustrating a 1T1R crossbar array circuit 503 in accordance with some implementations of the present disclosure.

In some implementations, as shown in FIG. 3, the 1T1R crossbar array circuit 503 includes one or more word lines (e.g., a first word line 501), one or more bit lines (e.g., a first bit line 502), one or more selector lines (e.g., a first selector line 504), one or more grounding lines (e.g., a first grounding line 506), one or more first group of transistors (e.g., a first transistor 507 or, to be more specific, an NMOS transistor 507), and one or more RRAM devices (e.g., an RRAM device 505).

The NMOS transistor 507 is connected in series with the RRAM device 505. The RRAM device 505 is connected between the NMOS transistor 507 (via an NMOS drain terminal 5075) and the first word line 502.

An NMOS source terminal 5073 of the NMOS transistor 507 is connected to the first bit line 502. An NMOS gate terminal 5071 of the NMOS transistor 507 is connected to a first selector voltage source provided via the first selector line 504. The selector voltage source enables the transistors to determine whether the RRAM device 505 is selected to be programmed or not.

As shown in FIG. 3, the first grounding line 506 is connected to a first body terminal 5077 of the NMOS transistor 507 and is grounded.

In some implementations, the first grounding line 506 is parallel to the first bit line 502.

In some implementations, the first grounding line 506 is formed between one or more bit lines. Therefore, the first grounding line 506 may function as a shielding plate (e.g., a metal shielding plate) for output signals at bit lines, which reduces the output crosstalk and improve the speed and accuracy, especially during in-memory computing operations.

In some implementations, the locations of the RRAM device 505 and the NMOS transistor 507 may be interchangeable. In some implementations, therefore, that the word line 501 may be connected to the first transistor 507 via the first drain terminal 5075, and the bit line 502 may be connected to the RRAM device 505.

Figure 4:
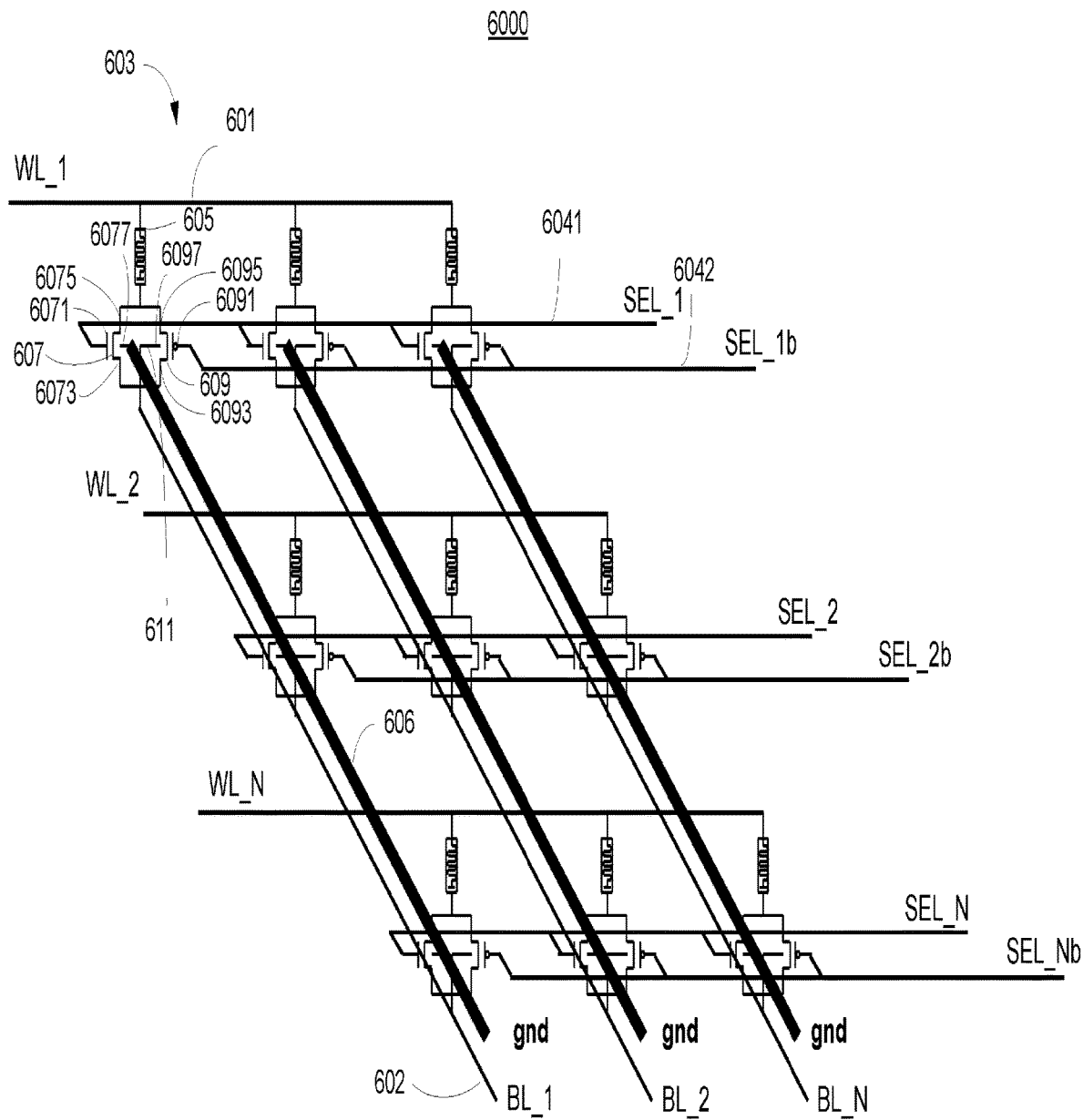
FIG. 4 is a block diagram illustrating an example PMOS-diode-connected 2T1R crossbar array circuit in accordance with some implementations of the present disclosure.

FIG. 4 is a block diagram 6000 illustrating a PMOS-diode-connected 2T1R crossbar array circuit 603 in accordance with some implementations of the present disclosure.

As shown in FIG. 4, a PMOS-diode-connected 2T1R crossbar array circuit 603 includes one or more word lines (e.g., a first word line 601), one or more bit lines (e.g., a first bit line 602), one or more first group of selector lines (e.g., a first selector line 6041), one or more second group of selector lines (e.g., a second selector line 6042), one or more grounding lines (e.g., a first grounding line 606), one or more first group of transistors (e.g., a first transistor 607 or, to be more specific, an NMOS transistor 607), one or more second group of transistors (e.g., a second transistor 609 or, to be more specific, a PMOS transistor 609), a diode 611, and an RRAM device 605. The NMOS transistor 607 and the PMOS transistor 609 are connected in series with the RRAM device 605.

The RRAM device 605 is connected between the NMOS transistor 607 and the first bit line 602 via an NMOS drain terminal 6075, and also between the PMOS transistor 609 and the first bit line 602 via a PMOS drain terminal 6095.

An NMOS gate terminal 6071 of the NMOS transistor 607 is connected to a first selector voltage source via the first selector line 6041, while a PMOS gate terminal 6091 of the PMOS transistor 609 is connected to a second selector voltage source via the second selector line 6042. It is noted that the selector voltage source enables the transistors to control whether the RRAM device 605 is selected to be programmed or not.

The diode 611 is connected between a PMOS body terminal 6097 of the PMOS transistor 609 and the first bit line 602.

In some implementations, the diode 611 is configured to provide a reverse bias to the PMOS transistor 609. This reverse bias increases the threshold gate voltage of transistors, resulting in higher selectivity and controllability of the transistors. In some implementations, the first grounding line 606 is connected to a first body terminal 6077 of the NMOS transistor 607 and is grounded.

In some implementations, the first grounding line 606 is parallel to the first bit line 602. In some implementations, the first grounding line 606 is formed between one or more bit lines. Therefore, the first grounding line 606 may function as a shielding plate (e.g., a metal shielding plate) for output signals at bit lines; such as shielding plate may reduce the output crosstalk and improve the speed and accuracy, especially during in-memory computing operations.

In some implementations, the locations of the RRAM device and two MOS transistors may be interchangeable, which means that the word line 601 may be connected to the first transistor 607 via the first drain terminal 6075, and the bit line 602 may be connected to the RRAM device 605.

In some implementations, the first selector line 6041 and the second selector line 6042 may be connected by an invertor such that the two selector voltage sources may be controlled by a single selector voltage source. In some implementations, the inverter includes an NMOS inverter, a PMOS inverter, a CMOS inverter, or a combination thereof.

It should also be noted that the one NMOS one PMOS 2T1R design is only an example implementation. A cross bar array may include more than one NMOS' and more than one PMOS', for example, two NMOS' and one PMOS, one NMOS and two PMOS' and two NMOS' and two PMOS'.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus, comprising:
a plurality of transistors comprising a first transistor and a second transistor;
an RRAM device connected in series with the first transistor and the second transistor;
a first bit line connected to the RRAM device; and
a grounding line, wherein the grounding line is connected to a first body terminal of the first transistor, wherein the grounding line is parallel to the first bit line.

2. The apparatus of claim 1, wherein the grounding line is grounded.

3. The apparatus of claim 2, wherein the RRAM device is connected between the first transistor and the first bit line via a first drain terminal of the first transistor, and wherein the RRAM device is connected between the second transistor and the first bit line via a second drain terminal of the second transistor.

4. The apparatus of claim 2, wherein a word line is connected to the first transistor via a drain terminal of the first transistor.

5. The apparatus of claim 2, wherein a first gate terminal of the first transistor is connected to a first selector voltage source via a first selector line, and wherein a second gate terminal of the second transistor is connected to a second selector voltage source via a second selector line.

6. The apparatus of claim 5, wherein the first selector line and the second selector line are connected by an inverter, and wherein the first selector voltage source and the second selector voltage source are controlled by a single selector voltage source.

7. The apparatus of claim 6, wherein the inverter comprises at least one of an NMOS inverter, a PMOS inverter, or a CMOS inverter.

8. The apparatus of claim 1, wherein the first transistor is an NMOS transistor, and the second transistor is a PMOS transistor.

9. The apparatus of claim 1, further comprising:
a diode connected between a second body terminal of the second transistor and the first bit line, wherein the diode is configured to provide a reverse bias to the second transistor.

10. The apparatus of claim 1, wherein the grounding line is formed between the first bit line and a second bit line.

* * * * *